(12) United States Patent
Erez et al.

(10) Patent No.: US 10,013,345 B2
(45) Date of Patent: Jul. 3, 2018

(54) STORAGE MODULE AND METHOD FOR SCHEDULING MEMORY OPERATIONS FOR PEAK-POWER MANAGEMENT AND BALANCING

(71) Applicant: SanDisk Technologies Inc., Plano, TX (US)

(72) Inventors: Eran Erez, San Jose, CA (US); Cynthia Hsu, Fremont, CA (US)

(73) Assignee: SanDisk Technologies LLC, Plano, TX (US)

( * ) Notice: Subject to any disclaimer, the term of this patent is extended or adjusted under 35 U.S.C. 154(b) by 290 days.

(21) Appl. No.: 14/489,179

(22) Filed: Sep. 17, 2014

(65) Prior Publication Data

US 2016/0077961 A1  Mar. 17, 2016

(51) Int. Cl.
| | | |
|---|---|---|
| *G06F 1/00* | (2006.01) | |
| *G06F 12/02* | (2006.01) | |
| *G11C 16/04* | (2006.01) | |
| *G11C 16/30* | (2006.01) | |
| *G06F 3/06* | (2006.01) | |
| *G06F 1/32* | (2006.01) | |

(52) U.S. Cl.
CPC ........ *G06F 12/0246* (2013.01); *G06F 1/3275* (2013.01); *G06F 3/0625* (2013.01); *G06F 3/0659* (2013.01); *G06F 3/0679* (2013.01); *G06F 3/0688* (2013.01); *G11C 16/04* (2013.01); *G11C 16/30* (2013.01); *G06F 2212/7201* (2013.01); *Y02B 60/1228* (2013.01); *Y02B 60/1246* (2013.01); *Y02D 10/14* (2018.01); *Y02D 10/154* (2018.01)

(58) Field of Classification Search
CPC ...... G06F 11/3058; G06F 1/28; G06F 1/3221; G06F 1/3225; G06F 1/26; G06F 8/665; G06F 1/3203; G11C 16/30
See application file for complete search history.

(56) References Cited

U.S. PATENT DOCUMENTS

| | | | |
|---|---|---|---|
| 7,370,220 B1 * | 5/2008 | Nguyen | G06F 1/26 713/300 |
| 8,745,369 B2 | 6/2014 | Yurzola et al. | |
| 9,093,160 B1 * | 7/2015 | Ellis | G11C 16/10 |
| 2010/0036998 A1 * | 2/2010 | Ben-Rubi | G06F 3/0625 711/100 |

(Continued)

OTHER PUBLICATIONS

International Search Report and Written Opinion in corresponding International Application No. PCT/US2015/044217, dated Oct. 23, 2015, 9 pages.

*Primary Examiner* — Thomas C Lee
*Assistant Examiner* — Zhipeng Wang
(74) *Attorney, Agent, or Firm* — Brinks Gilson & Lione

(57) ABSTRACT

A storage module and method for scheduling memory operations for peak-power management and balancing are provided. In one embodiment, a storage module maintains a count of time slots over a period of time. The period of time corresponds to an amount of time between periodic power peaks of a memory operation. For each time slot, the storage module determines whether to commence a memory operation on one or more of the plurality of memory dies based on whether a power peak generated in the time slot by the memory operation would exceed a power threshold allowed for the time slot. Other embodiments are provided.

25 Claims, 11 Drawing Sheets

(56) References Cited

U.S. PATENT DOCUMENTS

| | | |
|---|---|---|
| 2011/0173462 A1* | 7/2011 | Wakrat ...................... G06F 1/26 |
| | | 713/300 |
| 2012/0023346 A1 | 1/2012 | Byom et al. |
| 2012/0063234 A1* | 3/2012 | Shiga ...................... G11C 16/10 |
| | | 365/185.22 |
| 2012/0221880 A1* | 8/2012 | Kim ...................... G06F 1/3225 |
| | | 713/400 |
| 2012/0290864 A1 | 11/2012 | Seroff |
| 2012/0331207 A1 | 12/2012 | Lassa et al. |
| 2015/0095666 A1* | 4/2015 | Ananthakrishnan .. G06F 1/3212 |
| | | 713/300 |

\* cited by examiner

STORAGE MODULE AND METHOD FOR SCHEDULING MEMORY OPERATIONS FOR PEAK-POWER MANAGEMENT AND BALANCING

BACKGROUND

Some storage modules, such as solid-state drives (SSDs), contain a plurality of memory dies (e.g., in a multi-die package) that can be read or written in parallel. Such storage modules typically have a maximum power threshold that limits the number of operations that can be executed at any given time. For example, storage modules often need to minimize peak power consumption when simultaneously executing operations (e.g., erase operations) that have periodic power peaks. One way in which to manage peak power consumption is to limit the number of concurrent operations. While this approach guarantees the maximum power consumption is below a desired level, performance is limited by the number of allowed concurrent operations. Another way in which to manage peak power consumption is to stagger consecutive commands by a fixed time to avoid peak power consumption alignment. However, while staggering commands in this way can avoid alignment of the first peak, such staggering may not avoid alignment of subsequent peaks.

Additionally, memory operations often follow internal algorithms that can produce current consumption peaks, as current consumption peaks correlate to power peaks. When multiple memory dies operate in parallel (e.g., when multiple NAND dies are programmed), individual memory dies may have current peaks that align and generate very high instantaneous current consumption. Although the chance of all memory dies having their current peaks aligning at the same time is statistically low, some storage modules guard against this worst case scenario by intentionally degrading the performance of the memory to guarantee prevention of such peak alignment. Other storage modules address with by launching each microstep in a memory operation individually, but that approach requires high control bandwidth and bus utilization, which can result in performance degradation. Also, while memory dies can communicate with each other via hardware signals to align their operations, such hardware signals are usually bounded to package boundaries and are not optimized for multi-package devices.

Overview

Embodiments of the present invention are defined by the claims, and nothing in this section should be taken as a limitation on those claims.

By way of introduction, the below embodiments relate to a storage module and method for scheduling memory operations for peak-power management and balancing. In one embodiment, a storage module maintains a count of time slots over a period of time. The period of time corresponds to an amount of time between periodic power peaks of a memory operation. For each time slot, the storage module determines whether to commence a memory operation on one or more of the plurality of memory dies based on whether a power peak generated in the time slot by the memory operation would exceed a power threshold allowed for the time slot.

In another embodiment, a storage module is disclosed having a memory, a time slot counter, and a memory operation scheduler in communication with the memory and the time slot counter, wherein the memory operation scheduler is configured to determine whether to commence a memory operation in a given time slot counted by the time slot counter based on power already consumed in that time slot.

In another embodiment, a storage module is disclosed having a plurality of memory dies and a controller. Each of the memory dies is assigned a specific grace time slot and is configured to determine when to commence a memory operation sent to it by the controller to ensure that a power peak generated by the memory operation will occur partially or entirely in its assigned grace time slot.

Other embodiments are possible, and each of the embodiments can be used alone or together in combination. Accordingly, various embodiments will now be described with reference to the attached drawings.

DETAILED DESCRIPTION OF THE PRESENTLY PREFERRED EMBODIMENTS

As mentioned in the background section above, storage modules often need to minimize peak power consumption. Such peak power consumption may be caused by simultaneously executing operations that have periodic power peaks. Current methods for addressing this issue either degrade performance or do not fully address this problem. The following embodiments provide a storage module and method for scheduling memory operations that address this issue. Before turning to these and other embodiments, the following paragraphs provide a discussion of exemplary storage modules that can be used with these embodiments. Of course, these are just examples, and other suitable types of storage modules can be used.

Figure 1A:
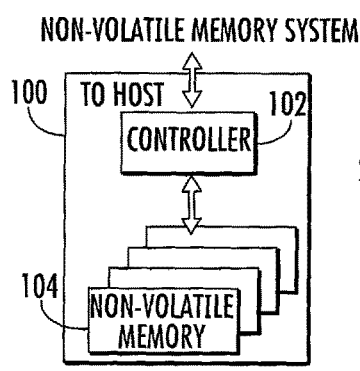
FIG. 1A is a block diagram of a non-volatile memory system of an embodiment.

FIG. 1A is a block diagram illustrating a non-volatile memory system according to an embodiment of the subject matter described herein. Referring to FIG. 1A, non-volatile memory system 100 includes a controller 102 and a non-volatile memory device 104. Controller 102 interfaces with a host system and transmits command sequences for read, program, and erase operations to non-volatile memory device 104. Examples of host systems include, but are not limited to, a mobile phone, a tablet computer, a digital media player, a game device, a personal digital assistant (PDA), a mobile (e.g., notebook, laptop) personal computer (PC), or a book reader.

The controller can take the form of a microprocessor or processor and a computer-readable medium that stores computer-readable program code (e.g., software or firmware) executable by the (micro)processor, logic gates, switches, an application specific integrated circuit (ASIC), a programmable logic controller, and an embedded microcontroller, for example. The controller can be configured with hardware and/or software to perform the various functions described below and shown in the flow charts. Also, some of the components shown as being internal to the controller can also be stored external to the controller, and other component can be used. Additionally, the phrase "operatively in communication with" could mean directly in communication with or indirectly (wired or wireless) in communication with through one or more components, which may or may not be shown or described herein.

Non-volatile memory device 104 may include any suitable non-volatile storage medium, including NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC), triple-level cells (TLC), or use other memory technologies, now known or later developed. Also, the memory cells can be arranged in a two-dimensional or three-dimensional fashion.

The interface between controller 102 and non-volatile memory device 104 may be any suitable flash interface, such as Toggle Mode 200, 400, or 800. In one embodiment, system 100 may be a card based system, such as a secure digital (SD) or a micro secure digital (micro-SD) card. In an alternate embodiment, system 100 may be part of an embedded memory system.

Although in the example illustrated in FIG. 1A, non-volatile memory system 100 (sometimes referred to herein as a storage module) includes a single channel between controller 102 and non-volatile memory device 104, the subject matter described herein is not limited to having a single memory channel. For example, in some NAND memory system architectures, 2, 4, 8 or more NAND channels may exist between the controller and the NAND memory device, depending on controller capabilities. In any of the embodiments described herein, more than a single channel may exist between the controller and the memory device, even if a single channel is shown in the drawings.

Figure 1B:
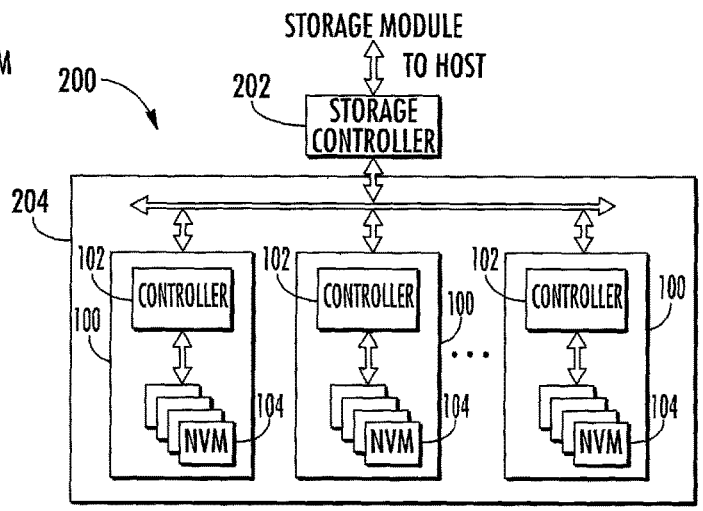
FIG. 1B is a block diagram illustrating an exemplary storage module of an embodiment.

FIG. 1B illustrates a storage module 200 that includes plural non-volatile memory systems 100. As such, storage module 200 may include a storage controller 202 that interfaces with a host and with memory system 204, which includes a plurality of non-volatile memory systems 100.

The interface between storage controller 202 and non-volatile memory systems 100 may be a bus interface, such as a serial advanced technology attachment (SATA) or peripheral component interface express (PCIe) interface. Storage system 200 illustrated in FIG. 1B, in one embodiment, may be a solid state drive (SSD), such as found in portable computing devices, such as laptop computers, tablet computers, and mobile phones.

Figure 1C:
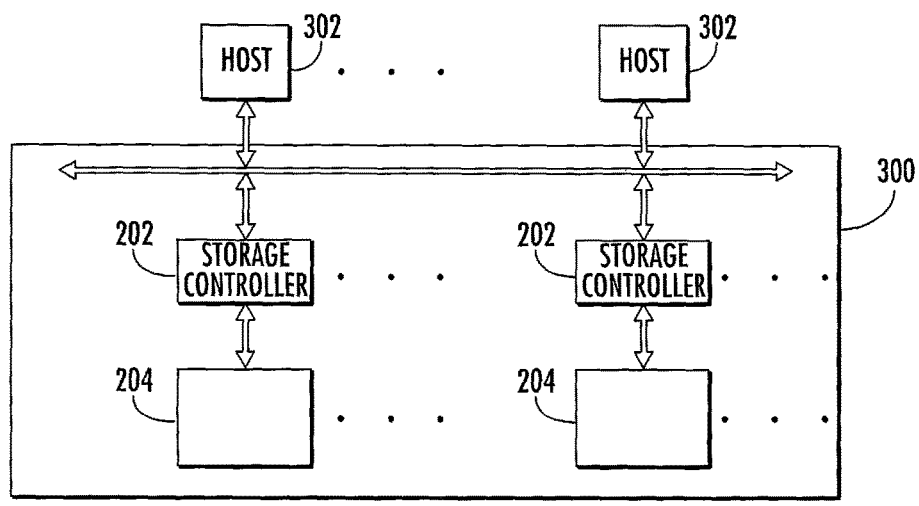
FIG. 1C is a block diagram illustrating a hierarchical storage system of an embodiment.

FIG. 1C is a block diagram illustrating a hierarchical storage system according to an embodiment. Referring to FIG. 1C, a hierarchical storage system 300 includes a plurality of storage controllers 202, each of which control a respective memory system 204. Host systems 302 may access memories within the storage system via a bus interface. In one embodiment, the bus interface may be a serial attached SCSI (SAS) or fiber channel over Ethernet (FCoE) interface. In one embodiment, the system illustrated in FIG. 1C may be a rack mountable mass storage system that is accessible by multiple host computers, such as would be found in a data center or other location where mass storage is needed.

Figure 2A:
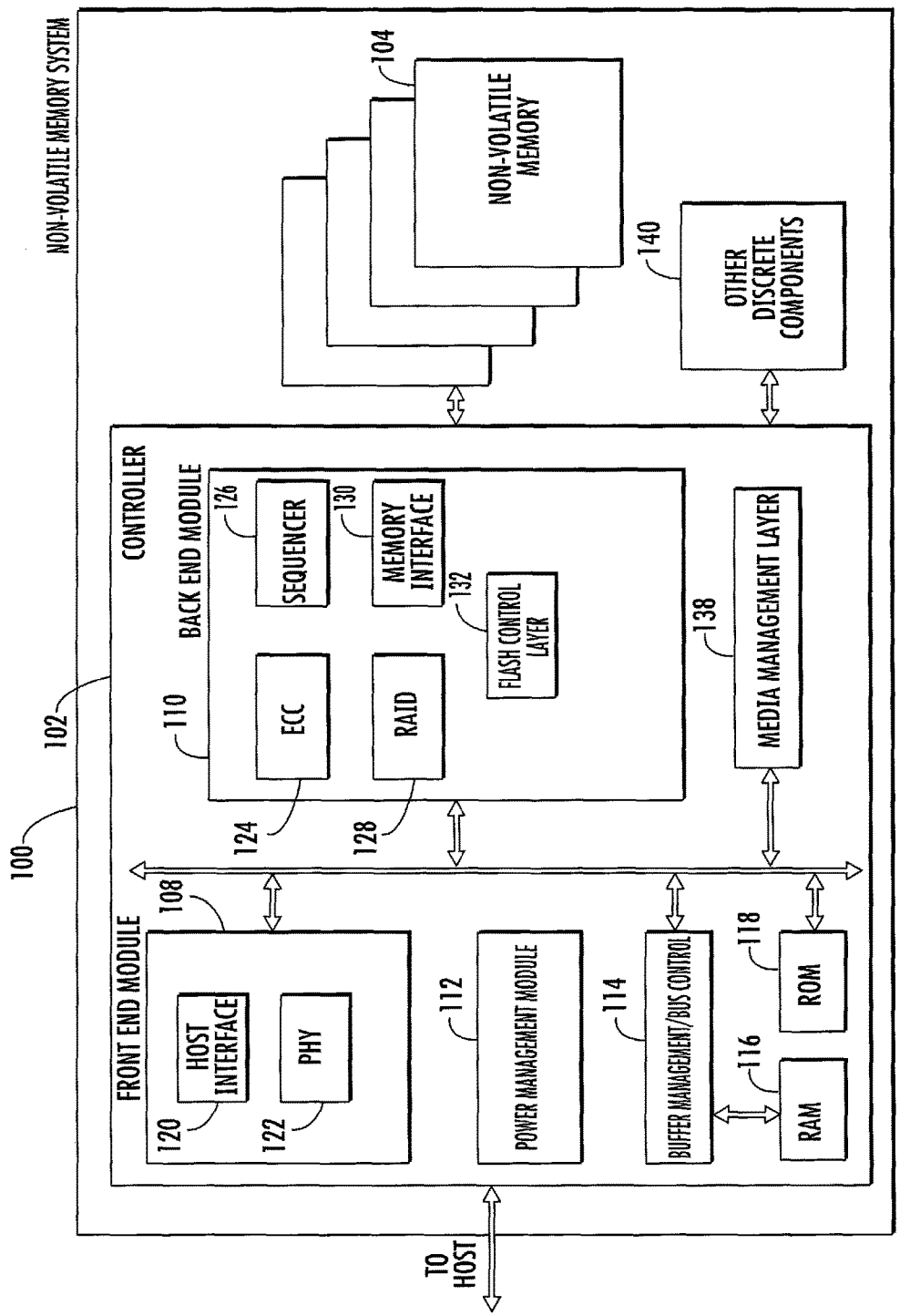
FIG. 2A is a block diagram illustrating exemplary components of the controller of the non-volatile memory system illustrated in FIG. 1A according to an embodiment.

FIG. 2A is a block diagram illustrating exemplary components of controller 102 in more detail. Referring to FIG. 2A, controller 102 includes a front end module 108 that interfaces with a host, a back end module 110 that interfaces with non-volatile memory device 104, and various other modules that perform functions which will now be described in detail. In the illustrated example, these modules include a power management module 112 that performs power management functions for controller 102. A buffer manager/bus controller 114 manages buffers in random access memory (RAM) 116 and controls the internal bus arbitration of controller 102. A read only memory (ROM) 118 stores system boot code. Front end module 108 includes a host interface 120 and a physical layer interface 122 that provide the electrical interface with the host or next level memory controller.

Back end module 110 includes an error correction controller (ECC) engine 124 that performs encoding on the data bytes received from the host and decoding and error correction on the data bytes read from the non-volatile memory. A command sequencer 126 generates command sequences, such as program and erase command sequences, to be transmitted to non-volatile memory device 104. A RAID (Redundant Array of Independent Drives) module 128 manages generation of RAID parity and recovery of failed data. The RAID parity may be used as an additional level of integrity protection for the data being written into the memory device 104. In some cases, the RAID module 128 may be a part of the ECC engine 124. A memory interface 130 provides the command sequences to non-volatile memory device 104 and receives status information from non-volatile memory device 104. In one embodiment, memory interface 130 may be a dual data rate (DDR) interface, such as a Toggle Mode 200, 400, or 800 interface. A flash control layer 132 controls the overall operation of back end module 110.

Additional components of system 100 illustrated in FIG. 2A include media management layer 138, which performs wear leveling of memory cells of non-volatile memory device 104. System 100 also includes other discrete components 140, such as external electrical interfaces, external RAM, resistors, capacitors, or other components that may interface with controller 102.

Figure 2B:
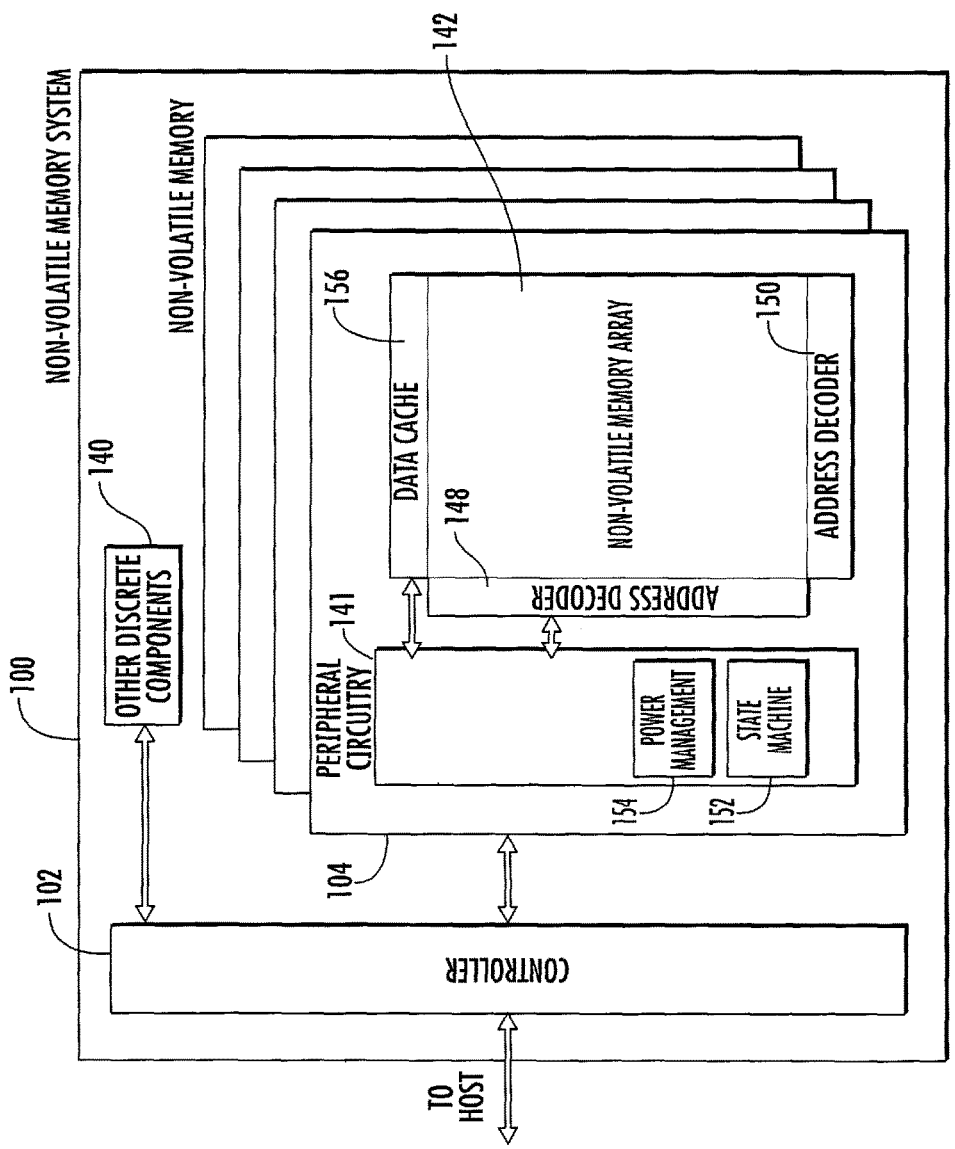
FIG. 2B is a block diagram illustrating exemplary components of the non-volatile memory of the non-volatile memory storage system illustrated in FIG. 1A according to an embodiment.

FIG. 2B is a block diagram illustrating exemplary components of non-volatile memory device 104 in more detail. Referring to FIG. 2B, non-volatile memory device 104 includes peripheral circuitry 141 and non-volatile memory array 142. Non-volatile memory array 142 includes the non-volatile memory cells used to store data. The non-volatile memory cells may be any suitable non-volatile memory cells, including NAND flash memory cells and/or NOR flash memory cells in a two dimensional and/or three dimensional configuration. Peripheral circuitry 141 includes a state machine 152 that provides status information to controller 102 and a power management module 154 that performs power management operations for non-volatile memory device 104. Non-volatile memory device 104 further includes a data cache 156 that caches data.

Figure 3:
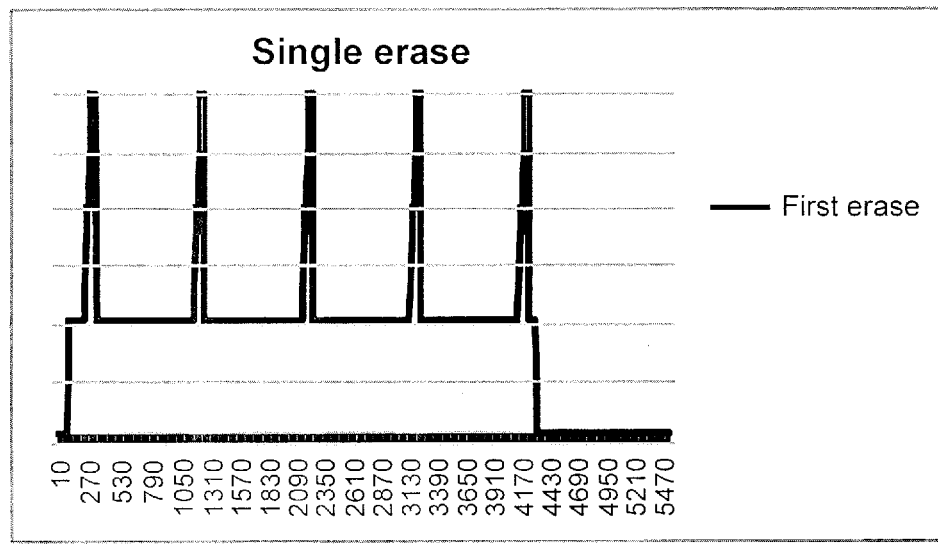
FIG. 3 is a graph showing periodic power peaks of a single erase operation of an embodiment.
Figure 4:
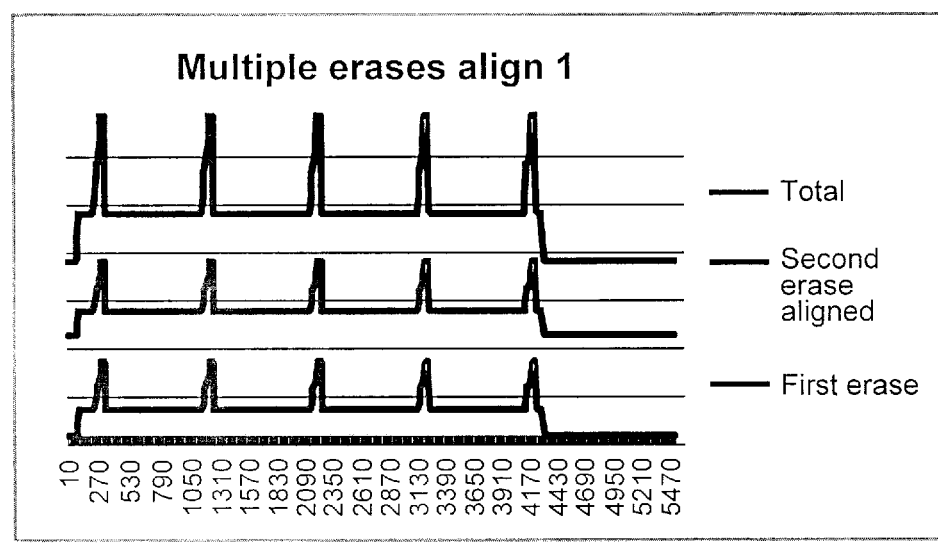
FIG. 4 is a graph showing alignment of periodic power peaks of multiple erase operations of an embodiment.
Figure 5:
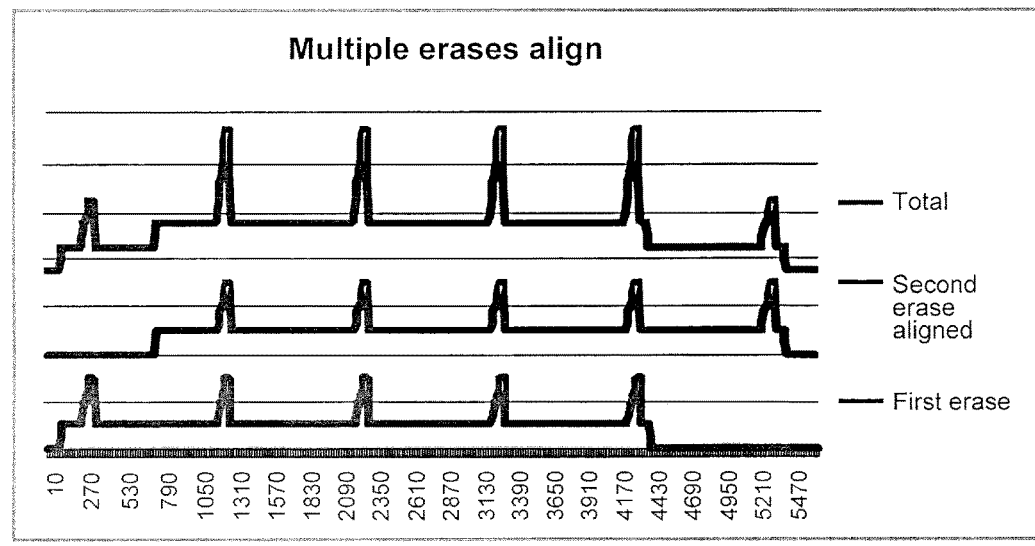
FIG. 5 is a graph showing alignment of periodic power peaks of staggered erase operations of an embodiment.
Figure 7:
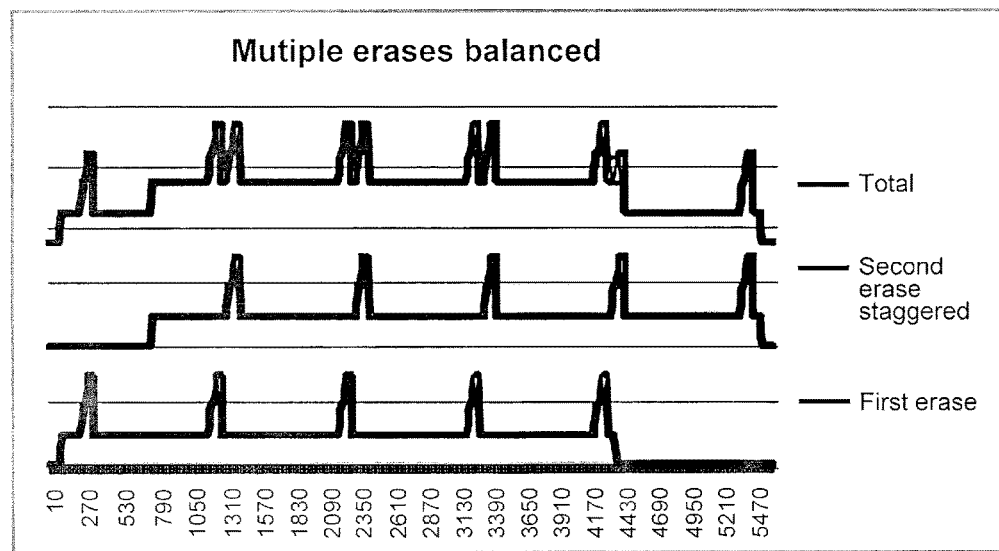
FIG. 7 is a graph showing balancing of periodic power peaks of multiple erase operations of an embodiment.

As mentioned above, storage modules often need to minimize peak power consumption when simultaneously executing operations across multiple memory dies when the operations have periodic power peaks. (While the following paragraphs will discuss peak power, it should be understood that the focus can instead be on peak current as peak current correlates to peak power.) For example, as shown in FIG. 3, a NAND erase operation is a peak-periodic operation with peaks that have a fixed duration (e.g., 100 us) occurring over a fixed period (e.g., once every 1 ms for a 4 ms). Issuing multiple erase commands simultaneously may result in peak current alignment. (While an erase operation is shown here, it should be understood that these embodiment can apply to other memory operations, such as read or write.) For example, as shown in FIG. 4, if erase operations are issued to Die[0] and Die[1] both at t=0 us, then it is likely that Die[0]/peak[0] will align with Die[1]/Peak[0], Die[0]/Peak[1] will align with Die[1]/Peak[1], and so on. As mentioned above, one way in which to manage peak power consumption is to stagger consecutive commands by a fixed time to avoid peak current consumption alignment. However, while staggering commands in this way can avoid alignment of the first peak, such staggering may not avoid alignment of subsequent peaks. For example, as shown in FIG. 5, if the Die[1] erase command is staggered to be issued more than 100 us after issuance of the Die[0] erase command, then it is guaranteed that Die[1]/Peak[1] will not align with Die[0]/Peak[1]. However, if the Die[1] erase command is issued 1 ms after Die[0], it is likely that Die[1]/Peak[1] will align with Die[0]/Peak[2], as shown in FIG. 5.

Figure 6:
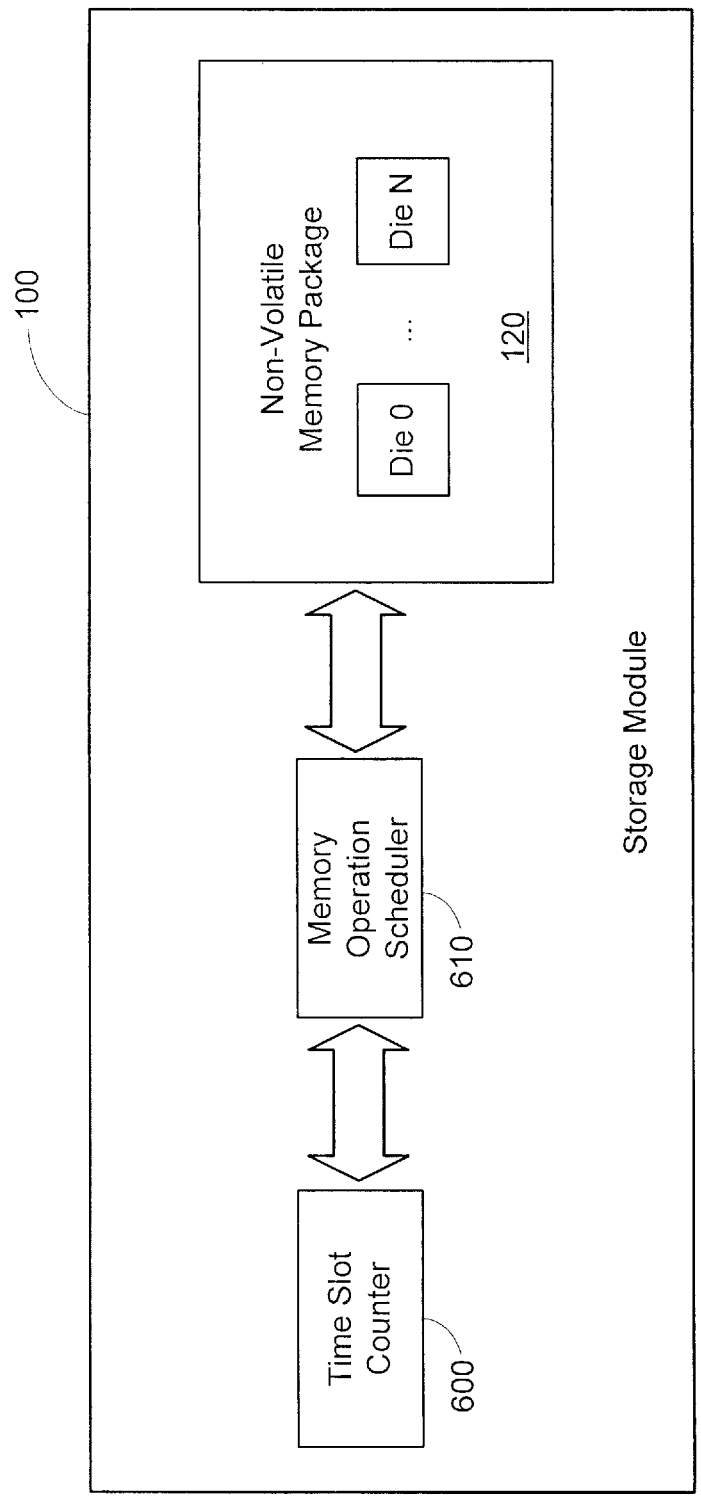
FIG. 6 is a block diagram of a storage module of an embodiment having a time slot counter and a memory operation scheduler.

The following embodiments provide methods for scheduling memory operations for peak power management. As shown in FIG. 6, in one embodiment, the storage module 100 can be configured with a time slot counter 600 and a memory operation scheduler 610. The time slot counter 600 and/or the memory operation scheduler 610 can be implemented as hardware only or hardware running software inside the storage module's controller 102 (FIG. 1) or outside of the controller 102. The time slot counter 600 counts time slots, and the memory operation scheduler 610 determines whether to commence a memory operation in a given time slot counted by the time slot counter 600 based on power already consumed in that time slot. In making this determination, the memory operation scheduler 610 can consider not only the power peak that would be generated in a given time slot by that particular memory operation but also the power peaks that are generated in that time slot by memory operations occurring simultaneously in other memory dies. In one embodiment, a time slot has a duration at least as long as a duration of a periodic power peak of the memory operation, and the time slot counter 600 resets its count after a period of time that is equal to the time between periodic power peaks of the memory operation. However, in general, the time slot can be longer, equal, or shorter than the duration of a period.

In one particular embodiment, the storage module 100 (e.g., the controller 102 and/or some other component(s)) is configured to maintain a count of time slots over a period of time. In this embodiment, the period of time corresponds to time between periodic power peaks of a memory operation (sometimes referred to herein as a "frame"). In this example, each time slot has a duration which may be set to be at least as long as a duration of a periodic power peak to completely avoid peak power alignment (although other durations may be chosen). Time slot duration may be set to a duration less than the periodic power peak in which case partial peak power alignment would be avoided. Using the values from the above example, each frame would be 1 ms, and each time slot would be at least 100 us. After reaching the last time slot of a frame (i.e., when reaching the end of the periodic cycle), the time slot count would reset to zero and start counting from there.

For each time slot, the storage module 100 determines whether to commence a memory operation in one or more of the plurality of memory dies based on whether a power peak generated in the time slot by the memory operation would exceed a threshold allowed for the time slot. The threshold can be any value and be in terms of the number of peaks or a power/current amount, for example. In this embodiment, for each time slot, the storage module 100 tracks power consumed by memory operations performed across the plurality of memory dies. So, when a memory operation is commenced in any of the memory dies, the storage module 100 increments the tracked power. Conversely, when a memory operation is completed, the storage module 100 decrements the tracked power. So, before commencing a new memory operation that would result in a power peak in the time slot, the storage module 100 can determine whether such power peak, in combination with any other power peaks that may be occurring in the other memory dies, would cause the threshold to be exceeded. If the threshold would not be exceeded, the storage module 100 can commence the memory operation (and add its power peak to its running total for the time slot). If the threshold would be exceeded, the storage module 100 can delay the start of the operation until reaching the start of a time slot that has "room" for the power peak (e.g., either an "empty" time slot or a time slot that still has "room" to accommodate the power peak of the new operation). The time slot the memory operation is to be delay to can be the first available time slot or some other time slot (e.g., the time slot with the fewest number of power peaks, a time slot with a number of power peaks below a certain amount, etc.). In this way, this embodiment balances the power peaks across the time slots in such a way that the power peaks will not exceed a limit for any given time slot.

Figure 8:
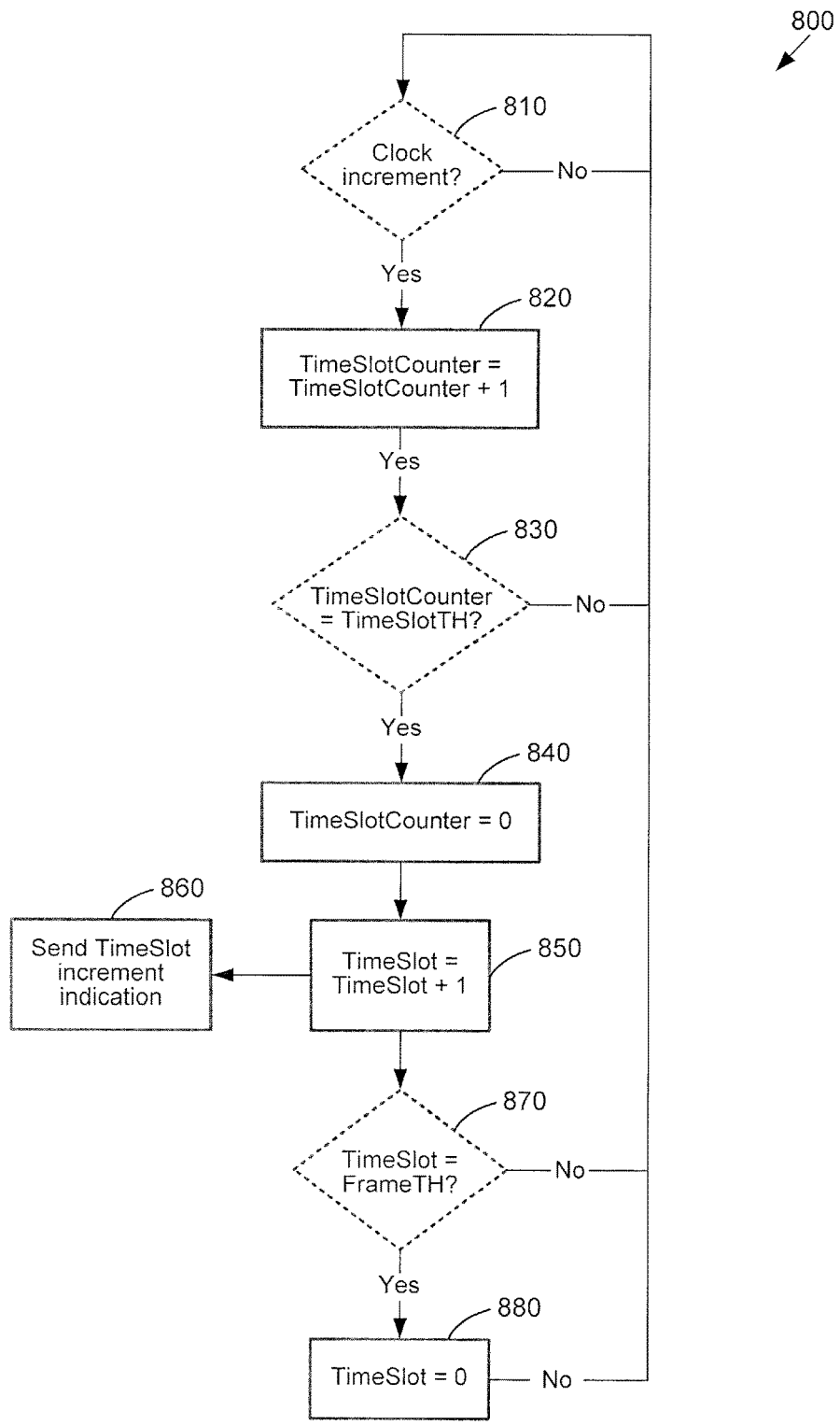
FIG. 8 is a flow chart of a method of an embodiment for counting time within a time slot and time slots within a frame.

As mentioned above, in one embodiment, the storage module 100 maintains a count of time slots over a period of time, where the period of time corresponds to time between periodic power peaks of a memory operation (a "frame"). FIG. 8 is a flow chart 800 of a method of an embodiment for counting time within a time slot and time slots within a frame. In this example, the controller 102 is configure to perform the acts in this and subsequent flow charts, although another component in the storage module 100 can be used instead of or in addition to the controller 102. As shown in FIG. 8, the controller 102 determines if there is a clock increment (act 810). If there is, the controller 102 increases the TimeSlotCounter variable by one (act 820). The controller 102 then determines if the TimeSlotCounter variable has reached a threshold (act 830). In this example, the threshold is 100 us, which is the duration of a slot in this example. If it has, the controller 102 resets the TimeSlot-Counter variable to zero (act 840), so, when acts 810-830 are later repeated, the counter starts back from zero. Next, the controller 102 increments the TimeSlot variable by 1 (act 850) and sends a TimeSlot increment indication (act 860), which will be described below. Then, the controller 102 determines if the TimeSlot variable has reached a threshold (act 870). In this example, the threshold is 10, which is the number of slots in a frame. If the threshold has not been reached yet, the controller 100 returns to the top of the flow chart 800 to continue counting out slots until the end of the frame, at which time the controller 102 resets the TimeSlot variable (act 880) to start counting the time slots in the next frame.

Figure 9:
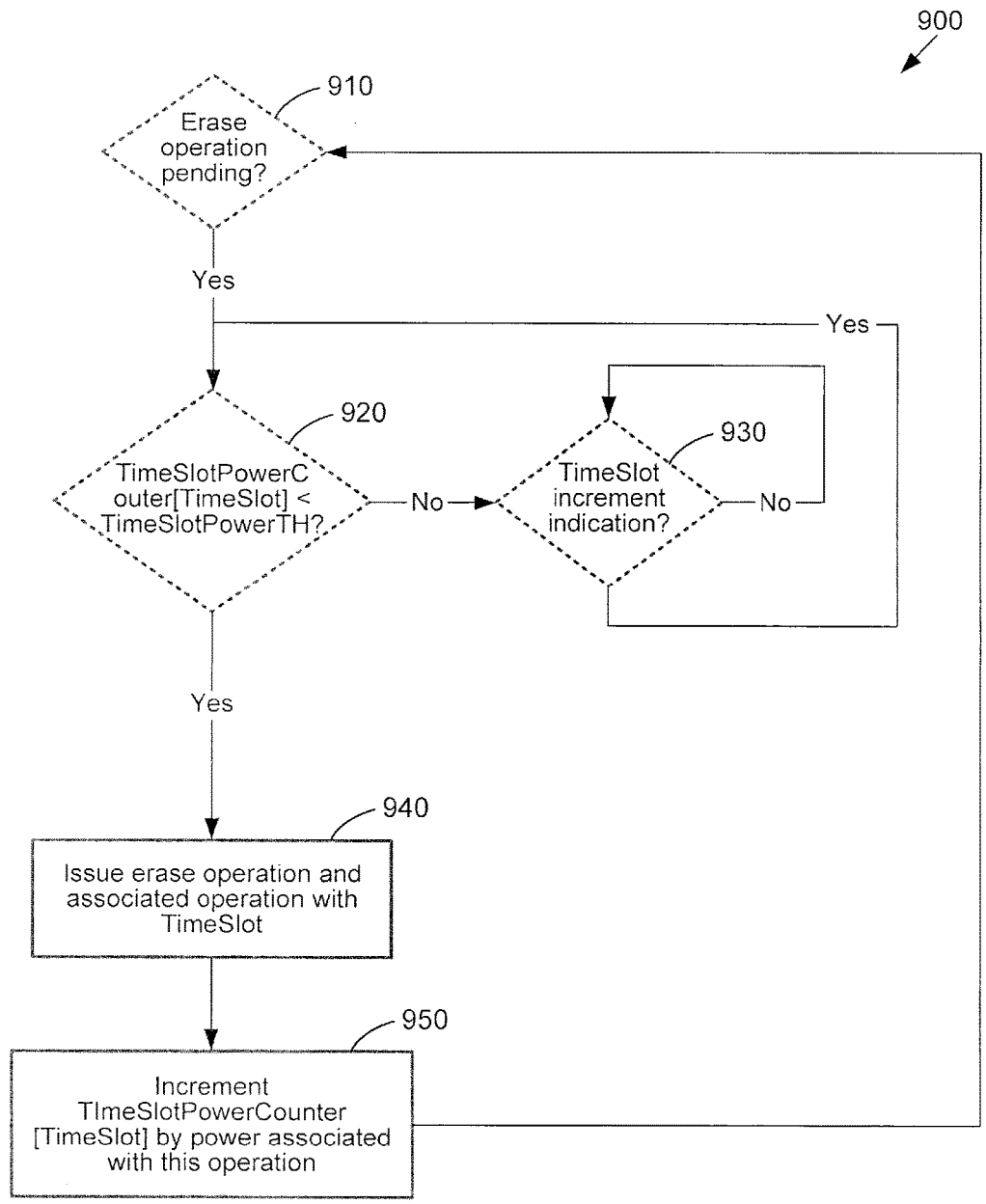
FIG. 9 is a flow chart of a method of an embodiment for determining the scheduling of pending erase operations.

Returning to the drawings, FIG. 9 is a flow chart 900 of a method of determining the scheduling of pending erase operations. As shown in FIG. 9, the controller 102 determines if there are any pending erase operations (act 910). If there are, the controller 102 determines if the TimeSlotPowerCounter variable for the current time slot is less than a threshold (act 920). For example, the storage module 100 may be limited to five peaks in a given time slot. If the threshold has not been reached, the controller 102 determines if a TimeSlot increment indication was generated (act 930). As mentioned above, when the controller 102 increments the TimeSlot variable, a TimeSlot increment indication is generated (act 860). If the TimeSlot increment indication was generated and the TimeSlotPowerCounter variable for the current time slot is less than the threshold, the controller 102 issues one of the pending erase operations (and any associated operation) associated with that time slot (act 940). The controller 102 then increments the TimeSlotPowerCounter variable for the current time slot by the power associated with the operation (act 950). This is because when a new erase operation is being issued, the relevant time slot operation count is being incremented by the amount of power associated with the operation. This flow chart 900 is then repeated for the other pending erase operations.

Figure 10:
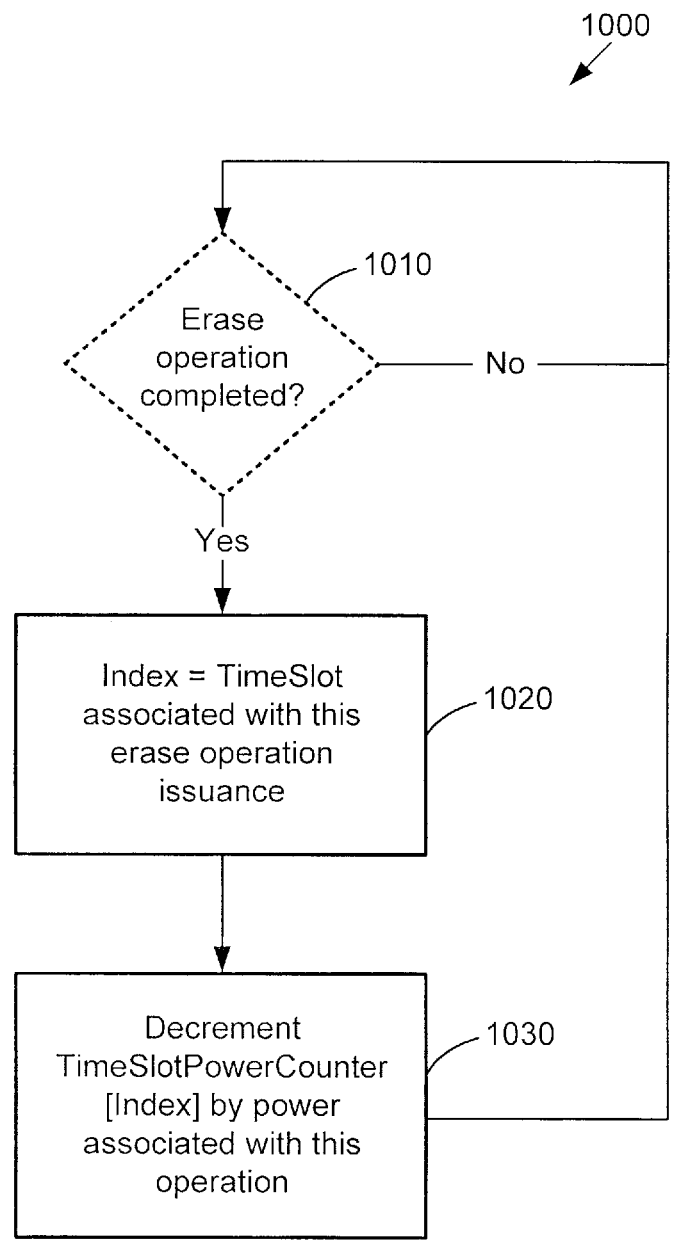
FIG. 10 is a flow chart of a method of an embodiment for updating a time slot power counter.

Turning now to the flow chart 1000 in FIG. 10, when the controller 102 determines that an erase operation is complete (act 1010), the controller 102 sets an index value to the TimeSlot associated with the erase operation (act 1020). The controller 102 then decrements the TimeSlotPowerCounter for the current time slot by the power associated with the completed operation (act 1010). This is because when an erase operation completes, the relevant time slot operation count is being decremented by the amount of power associated with the operation that completed.

There are several alternatives that can be used with these embodiments. For example, it may be desired to use the same balancing system described above irrespective of memory type. However, some memory types may have different periodicity patterns than others. In order to harmonize these differences, the storage module 100 can support an operation-cycle delay feature in which "shorter" memory operations would be extended to be the exact cycle duration as a "longer" memory operation.

Figures 11, 12:
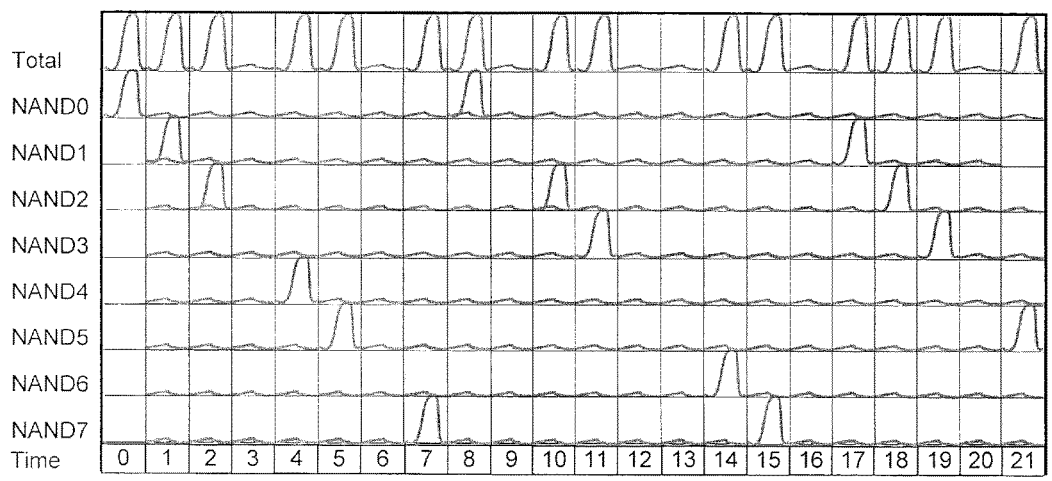
FIG. 11 is diagram of grace slots of various memory dies of an embodiment.
FIG. 12 is a graph showing power balancing of an embodiment.

As another alternate embodiment, instead of the controller 102 scheduling memory operations based on the power consumption levels of a given time slot, the controller 102 can just send the memory operations to the memory dies, and each of the memory dies can be configured to individually determine when to commence its memory operation based on the grace slot assigned to the memory die. This is shown in FIG. 11, where each of eight NAND memory dies is assigned a different "grace slot" in which it is allowed to have a power peak. All of the NAND dies are preferably synchronized and can keep track of which time slot is active.

When a memory die gets memory operation(s) from the controller 102 or is to perform internal memory operation(s), it can determine when to commence the operation(s) to ensure that the power peak(s) generated by those operation(s) will fall in its assigned grace slot. Because various memory die would have a various assigned grace slot, this embodiment can ensure that a power threshold is not exceed at any given time slot, as shown in the graph of FIG. 12. In contrast to prior approaches, this embodiment allows the controller 102 to offload the memory operation to the memory die and does not require accurate scheduling in commencing the operation to the memory die. This embodiment also addresses memory operations which are not periodic or operations with alternating periodicity.

In general, in this embodiment, each memory die is allowed to begin an operation that includes a peak (i.e., peak operation) at a designated slot (or slots). This designated slot is chosen to guarantee the peak will align to a specific slot. Different memory dies are configured in a way that guarantees their peak consumption is uniformly distributed over time, thus reducing (or eliminating) the probability of multiple peak consumption alignment. In the following example, the time lot is 1 us, and a time frame is composed of N time slots, numbered from 0 until N−1 (e.g., an 8 slot frame). The counter points to the active slot and counts from N−1 to 0. The grace slot (or slots) is the slot (or slots) at which the memory die is allowed to start an operation that involves peak. There may be more than one class of grace slot (e.g., a Program grace slot, a Program verify grace slot, etc.) The different classes of grace slots can be chosen in a way that guarantees each operation and the relevant peak consumption slot. For example, if a program operation is initiated and it is known that peak consumption will happen three time slots after this initiation and program grace slot is designated as 1, then it is expected that the program operation peak will occur at slot 4 (1+3). In this same memory die, if a program verify operation is initiated and it is known that peak consumption will happen 2 time slots after this initiation and the program verify grace slot is designated as 2, then it is expected that the program verify operation peak will too occur at slot 4 (2+2). Therefore, by setting Program and Program verify grace slots to be 1 and 2 respectfully, this memory die is guaranteed to peak only when 4 is the active slot.

Figure 13:
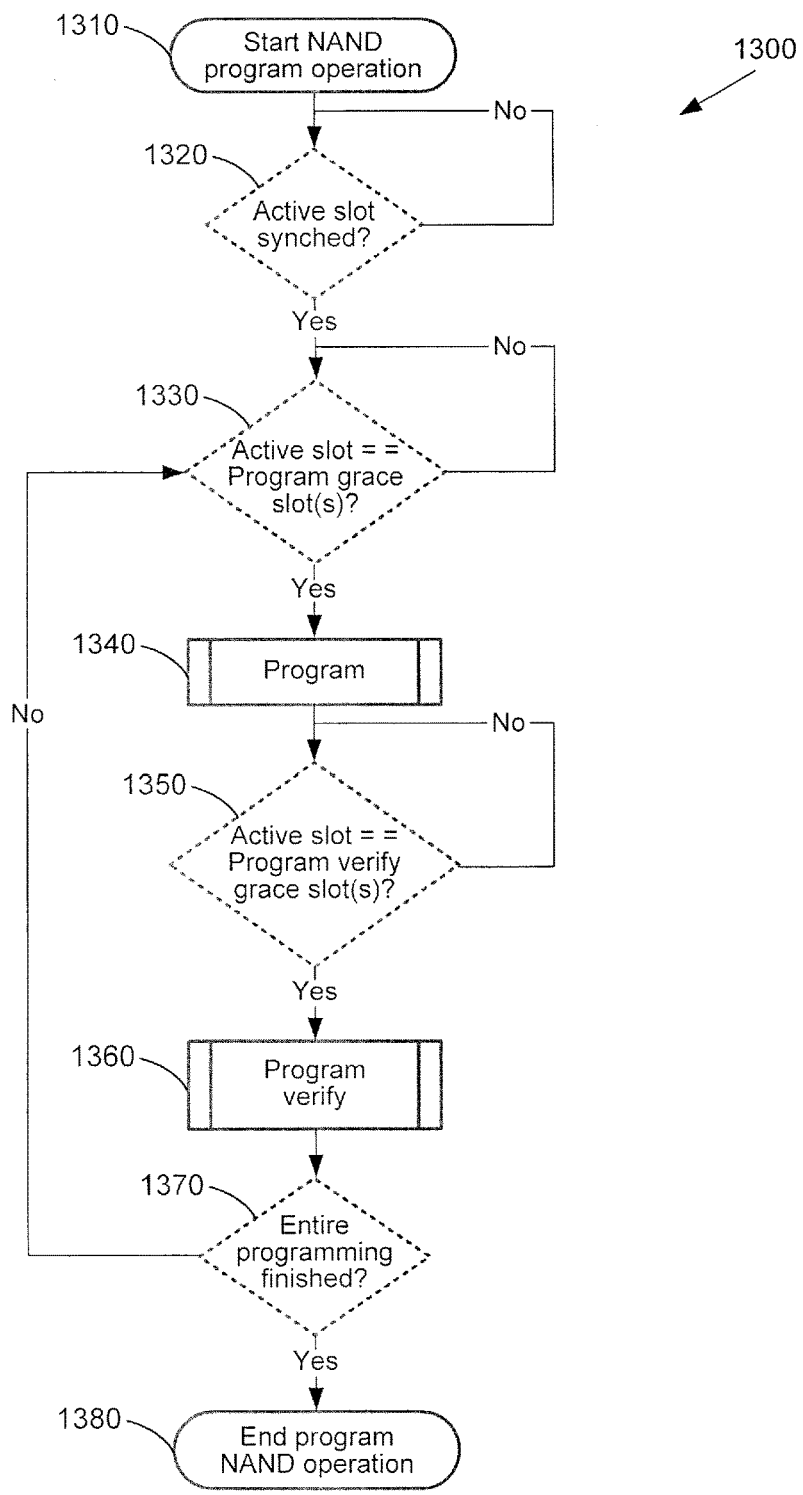
FIG. 13 is a flow chart of a method of an embodiment for power balancing.

FIG. 13 is a flow chart 1300 of a method of an embodiment for power balancing for program and verify operations. (Note that, in this embodiment chart, it is assumed that each program is followed by program verify step. In other embodiment, a program verify step is not performed.) As shown in FIG. 13, after a memory die receives a command to start a memory operation (act 1310), it determines what the active slot is (act 1320). If the active slot is that memory die's grace slot (act 1330), it will start the program operation (act 1340). The memory die then determines if the active slot is that memory die's program verify grace slot (act 1350). If it is, the memory die performs the program verify operation (act 1360). If the entire programming is not finished (act 1370), the above steps are repeated. Otherwise, the program operation is ended (act 1380).

In one particular embodiment, each memory die is configured to support the following commands: (a) setting basic time slot duration (e.g., in NAND clock cycles), (b) initializing a time frame (i.e., configuring how many time slots in a frame), (c) setting all different class' grace slot(s), and (d) setting an active slot (i.e., synchronizing the NAND timer counter to a global one, which resides at the controller 102). (This clock synchronization may need to be issued only after the program command because, prior to this point, the NAND clocks may be parked. Therefore, the NAND may need to wait for this initial synchronization prior to allowing the first internal operation.) Each memory die is also preferably capable of maintaining the active slot accurately during operation and waiting for the appropriate grace slot before initiating a peak memory operations.

Also, in this embodiment, the controller 102 is configured to set the active slot. (The memory die is not required to keep a clock running when not active, but the memory die cycle clock can be synchronized periodically during operation if die-to-die clock accuracy variation is expected to be significant (i.e., in cached access mode)). The memory controller 102 configures the memory dies appropriately by assigning each memory die with grace slot(s). Before issuing a memory operation to a memory die (e.g., after the controller transfers the data and address but before memory die actually starts the operation), the controller 102 can set the active slot, which in fact synchronizes the specific memory die to the rest of the system. From there, the memory die can track the active slot, adjust its internal state machine to delay initiation of peak consuming operations (e.g., program or program-verify step) until the active slot is equal to the memory dies' grace slot. The grace slot can be allocated statically or dynamically. In a static allocation, the grace slot can be allocated based on a full performance case, which has the advantage of being simple to implement but may be suboptimal when there are light loads (i.e., fixed peak delay). In a dynamic allocation, the grace slots are allocated based on the actual number of NAND dies operating in parallel. Dynamic allocation may be complicated and requires reconfiguration of the memory dies to reduce the number of active slots when new memory operation is added.

Finally, as mentioned above, any suitable type of memory can be used. Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the preferred embodiments described herein can be used alone or in combination with one another.

What is claimed is:

1. A method for scheduling a memory operation, the method comprising:
    performing the following in a memory die in a storage module having a plurality of memory dies:
        maintaining a count of time slots over a period of time, wherein the period of time corresponds to an amount of time between periodic power peaks of a memory operation, wherein each of the plurality of memory dies is assigned a different one of the time slots in which to have a power peak;
        determining whether to commence a memory operation in the memory die in a current time slot based on whether commencing the memory operation in the current time slot will cause a power peak of the memory operation to occur in the time slot assigned to the memory die, wherein the power peak of the memory operation occurs a predetermined number of time slots after commencement of the memory operation;
        in response to determining to commence the memory operation in the memory die in the current time slot, commencing the memory operation in the memory die; and
        in response to determining not to commence the memory operation in the memory die in the current time slot, delaying commencement of the memory operation until a later time slot to cause the power peak of the memory operation to occur in the time slot assigned to the memory die;
    wherein because each of the memory dies is assigned a different one of the time slots in which to have a power peak, power peaks are distributed over time to reduce a probability of multiple power peak consumption alignment.

2. The method of claim 1 further comprising tracking power consumed by memory operations performed across the plurality of memory dies.

3. The method of claim 2 further comprising incrementing the tracked power when the memory operation commences.

4. The method of claim 2 further comprising decrementing the tracked power when the memory operation is completed.

5. The method of claim 1, wherein the memory operation comprises an erase operation.

6. The method of claim 1, wherein at least one of the memory dies comprises a three-dimensional memory.

7. The method of claim 1, wherein the storage module is embedded in a host.

8. The method of claim 1, wherein the storage module is removably connected to a host.

9. The method of claim 1, wherein the storage module is a solid-state drive.

10. A storage module comprising:
    a plurality of memory dies;
    means for maintaining a count of time slots over a period of time, wherein the period of time corresponds to an amount of time between periodic power peaks of a memory operation, wherein each of the plurality of memory dies is assigned a different one of the time slots in which to have a power peak; and
    means for determining whether to commence a memory operation in a memory die in a current time slot based on whether commencing the memory operation in the current time slot will cause a power peak of the memory operation to occur in the time slot assigned to the memory die, wherein the power peak of the memory operation occurs a predetermined number of time slots after commencement of the memory operation;
    means for, in response to determining to commence the memory operation in the memory die in the current time slot, commencing the memory operation in the memory die; and
    means for, in response to determining not to commence the memory operation in the memory die in the current time slot, delaying commencement of the memory operation until a later time slot to cause the power peak of the memory operation to occur in the time slot assigned to the memory die;
    wherein because each of the memory dies is assigned a different one of the time slots in which to have a power peak, power peaks are distributed over time to reduce a probability of multiple power peak consumption alignment.

11. The storage module of claim 10 further comprising means for tracking power consumed by memory operations performed across the plurality of memory dies.

12. The storage module of claim 11 further comprising means for incrementing the tracked power when the memory operation commences.

13. The storage module of claim 11 further comprising means for decrementing the tracked power when the memory operation is completed.

14. The storage module of claim 10, wherein the memory operation comprises an erase operation.

15. The storage module of claim 10, wherein at least one of the memory dies comprises a three-dimensional memory.

16. The storage module of claim 10, wherein the storage module is embedded in a host.

17. The storage module of claim 10, wherein the storage module is removably connected to a host.

18. The storage module of claim 10, wherein the storage module is a solid-state drive.

19. A storage module comprising:
a plurality of memory dies; and
a controller;
wherein each of the memory dies is configured to:
maintain a count of time slots over a period of time, wherein the period of time corresponds to an amount of time between periodic power peaks of a memory operation, wherein each of the plurality of memory dies is assigned a different one of the time slots in which to have a power peak; and
determine whether to start a memory operation in a memory die in an active time slot based on whether starting the memory operation in the active time slot will cause a power peak of the memory operation to occur in the time slot assigned to the memory die, wherein the power peak of the memory operation occurs a predetermined number of time slots after starting the memory operation;
in response to determining to start the memory operation in the memory die in the active time slot, start the memory operation in the memory die in the active time slot; and
in response to determining not to start the memory operation in the memory die in the active time slot, delay starting the memory operation until a later active time slot to cause the power peak of the memory operation to occur in the time slot assigned to the memory die;
wherein because each of the memory dies is assigned a different one of the time slots in which to have a power peak, power peaks are distributed over time to reduce a probability of multiple power peak consumption alignment.

20. The storage module of claim 19, wherein the controller is configured to assign a time slot to each memory die.

21. The storage module of claim 19, wherein the controller is configured to send an indication of an active time slot to the plurality of memory dies.

22. The storage module of claim 19, wherein at least one of the memory dies comprises a three-dimensional memory.

23. The storage module of claim 19, wherein the storage module is embedded in a host.

24. The storage module of claim 19, wherein the storage module is removably connected to a host.

25. The storage module of claim 19, wherein the storage module is a solid-state drive.

* * * * *